United States Patent
Ning

(10) Patent No.: US 9,472,556 B1
(45) Date of Patent: Oct. 18, 2016

(54) SOI LATERAL BIPOLAR FOR INTEGRATED-INJECTION LOGIC SRAM

(71) Applicant: International Business Machines Corporation, Armonk, NY (US)

(72) Inventor: Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/997,176

(22) Filed: Jan. 15, 2016

(51) Int. Cl.
| | |
|---|---|
| *H01L 27/102* | (2006.01) |
| *H01L 27/11* | (2006.01) |
| *H01L 27/12* | (2006.01) |
| *H01L 29/08* | (2006.01) |

(52) U.S. Cl.
CPC .......... *H01L 27/1025* (2013.01); *H01L 27/11* (2013.01); *H01L 27/1203* (2013.01); *H01L 29/0808* (2013.01); *H01L 29/0821* (2013.01)

(58) Field of Classification Search
CPC .......................... H01L 24/1025; H01L 27/11
See application file for complete search history.

(56) References Cited

U.S. PATENT DOCUMENTS

| | | | |
|---|---|---|---|
| 8,531,001 B2 | 9/2013 | Cai et al. | |
| 2016/0093623 A1* | 3/2016 | Luan ..................... | H01L 21/768 257/133 |
| 2016/0148940 A1* | 5/2016 | Luan ................... | H01L 27/1104 438/134 |

OTHER PUBLICATIONS

Toh, K.-Y., et al., "A 1.9ns/6.3W/256Kb Bipolar SRAM Design", IEEE Bipolar Circuits and Technology Meeting 3.4, Sep. 17-18, 1990, pp. 71-74.

Cai, J. et al., "SOI Lateral Bipolar Transistor with Drive Current >3mA/μm", SOI-3D-Subthreshold Microelectronics Technology Unified Conference (S3S), Oct. 7-10, 2013 IEEE, pp. 1-2.

Ning, T. H., et al. "On the Performance and Scaling of Symmetric Lateral Bipolar Transistors on SOI", IEEE Journal of the Electron Devices Society, Jan. 2013, pp. 21-27, vol. 1, No. 1.

Cai, J., et al., "Complementary Thin-Base Symmetric Lateral Bipolar Transistors on SOI", Electron Devices Meeting (IEDM), 2011 IEEE International, Dec. 5-7, 2011, pp. 16.3.1-16.3.4.

Wiedmann, S. K., et al., "High-speed split-emitter I2L/MTL memory cell", IEEE Journal of Solid-State Circuits, Oct. 1981, pp. 429-434, vol. 16, Issue: 5.

Wiedmann, S. K., et al., "High-speed split-emitter I2L/MTL memory cell", IEEE International Solid-State Circuits, Feb. 19, 1981, pp. 158-159, 268.

* cited by examiner

*Primary Examiner* — Yu-Hsi D Sun
(74) *Attorney, Agent, or Firm* — Scully, Scott, Murphy & Presser, P.C.; Louis J. Percello, Esq.

(57) ABSTRACT

A static random access memory (SRAM) cell is provided. The SRAM cell consists of two cross coupled integrated-injection logic (I²L) inverter devices. Each inverter device contains two lateral bipolar transistors (e.g., NPN- and PNP-type lateral bipolar transistors). Each of the inverter devices, and hence each lateral bipolar transistor, is formed on a surface of an insulator layer of a semiconductor-on-insulator (SOI) substrate.

20 Claims, 6 Drawing Sheets

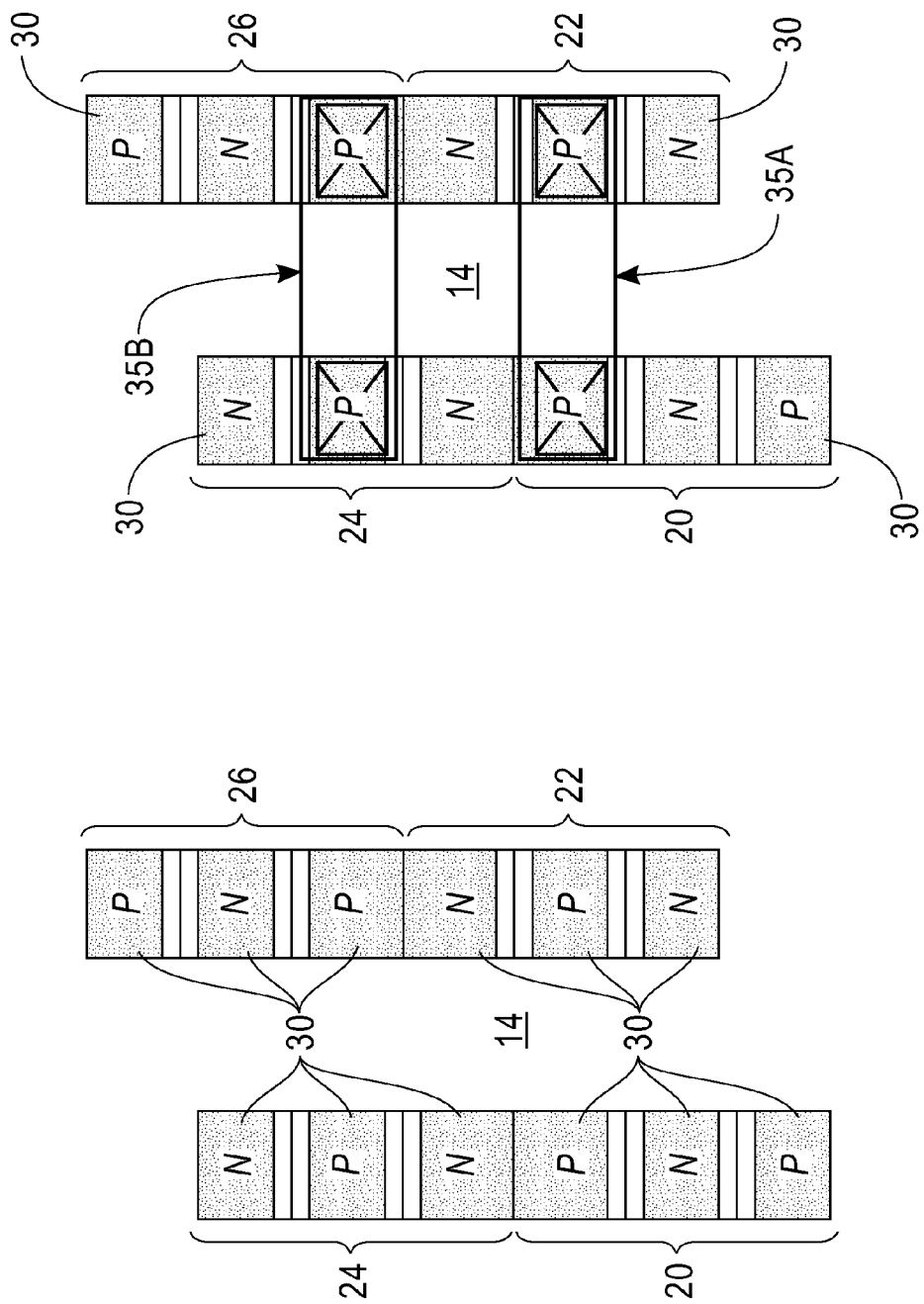

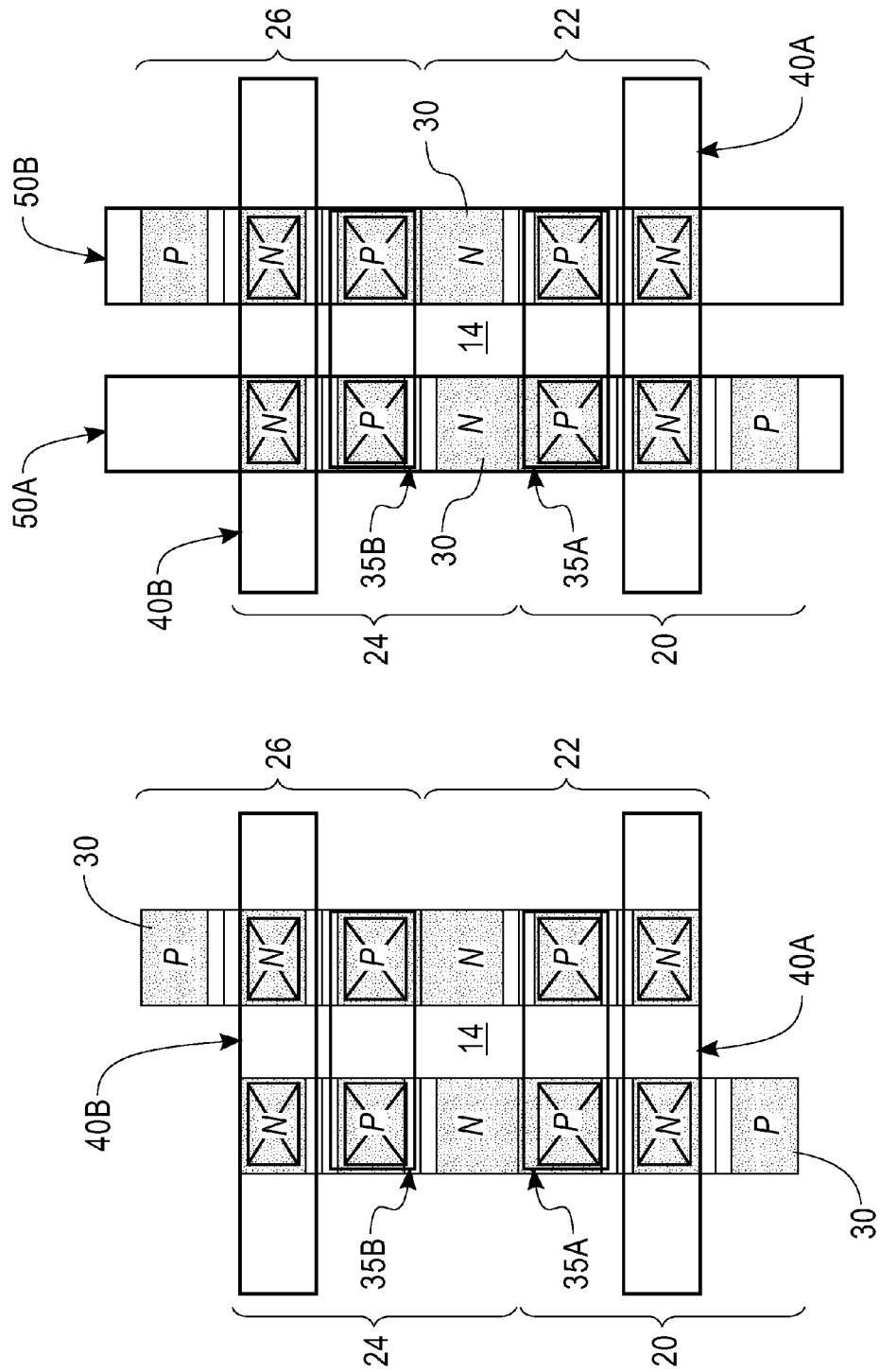

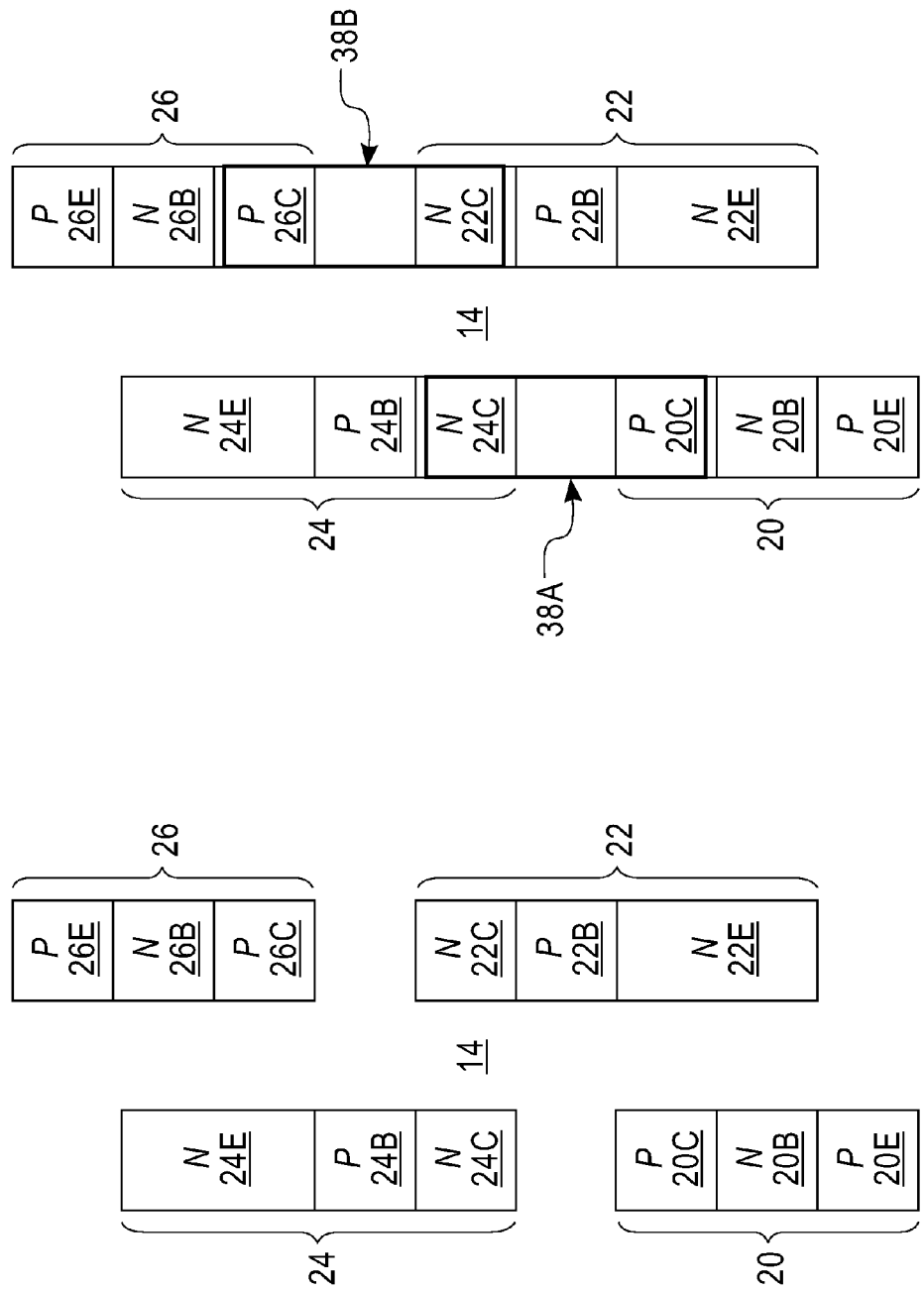

SOI LATERAL BIPOLAR FOR INTEGRATED-INJECTION LOGIC SRAM

BACKGROUND

The present application relates to a memory cell, and more particularly to an integrated-injection logic (I²L) static random access memory (SRAM) cell that includes semiconductor-on-insulator (SOI) symmetrical bipolar transistors.

Integrated-injection logic (I²L) (sometimes also referred to as merged-transistor logic, MTL) technology presents a large potential for high-density and low-power static random access memory (SRAM) since it offers a very compact device structure and a nearly ideal nonlinear load device with a large impedance range (typically $10^2$ to $10^8$ ohms).

I²L is a class of digital circuits built with multiple collector bipolar transistors. The heart of an I²L circuit is the common emitter open collector inverter. Typically, an inverter consists of an NPN transistor with the emitter connected to ground and the base biased with a forward current. The input is supplied to the base, while the output of an inverter is at the collector. To understand how the inverter operates, it is necessary to understand the current flow. If the bias current is shunted to ground (low logic level), the NPN transistor turns off and the collector floats (high logic level). If the bias current is not shunted to ground because the input is high-z (high logic level), the bias current flows through the transistor to the emitter, switching on the transistor, and allowing the collector to sink current (low logic level). Because the output of the inverter can sink current but cannot source current, it is safe to connect the outputs of multiple inverters together to form a wired AND gate.

Digital bipolar transistors using vertical transistors are fast, with circuit delays reaching sub-5 ps. However, the large power dissipation makes vertical bipolar transistors not suitable for VLSI applications. As such, there is a need for providing an I²L SRAM cell in which the power dissipation issue has been circumvented.

SUMMARY

In one aspect of the present application, a memory cell, i.e., SRAM cell, is provided. In one embodiment of the present application, the memory cell includes a first inverter device containing a first PNP-type lateral bipolar transistor and a first NPN-type lateral bipolar transistor, and a second inverter device containing a second PNP-type lateral bipolar transistor and a second NPN-type lateral bipolar transistor. Each lateral bipolar transistor is present on an insulator layer and contains an emitter terminal, a base terminal and a collector terminal. In accordance with the present application, the collector terminals of the first PNP-type lateral bipolar transistor and the second NPN-type lateral bipolar transistor are electrically connected, i.e., shorted together, and the collector terminals of the first NPN-type lateral bipolar transistor and the second PNP-type lateral bipolar transistor are electrically connected, i.e., shorted together.

The memory cell further includes electrically connection between the collector terminal of the first PNP-type lateral bipolar transistor and the base terminal of the first NPN-type lateral bipolar transistor and electrically connection between the collector terminal of the second PNP-type lateral bipolar transistor and the base terminal of the second NPN-type lateral bipolar transistor. Also, a first wordline electrically connects the emitter terminal of the first NPN-type lateral bipolar transistor to the base terminal of the first PNP type lateral bipolar transistor, a second wordline electrically connects the emitter terminal of the second NPN-type lateral bipolar transistor to the base terminal of the second PNP-type lateral bipolar transistor, and a first bitline electrically contacts the emitter terminal of the first PNP-type lateral bipolar transistor and a second bitline electrically contacts the emitter terminal of the second PNP-type transistor.

In another aspect of the present application, a method of forming a memory cell, i.e., SRAM cell, is provided. In one embodiment of the present application, the method may include providing a first inverter device containing a first PNP-type lateral bipolar transistor and a first NPN-type lateral bipolar transistor, and a second inverter device containing a second PNP-type lateral bipolar transistor and a second NPN-type lateral bipolar transistor, wherein each lateral bipolar transistor is formed on an insulator layer and contains an emitter terminal, a base terminal and a collector terminal. Next, the collector terminals of the first PNP-type lateral bipolar transistor and the second NPN-type lateral bipolar transistor are electrically connected, i.e., shorted together, and the collector terminals of the first NPN-type lateral bipolar transistor and the second PNP-type lateral bipolar transistor are electrically connected, i.e., shorted together. Next, and in another electrically connection step, the collector terminal of the first PNP-type lateral bipolar transistor is electrically connected to the base terminal of the first NPN-type lateral bipolar transistor and the collector terminal of the second PNP-type lateral bipolar transistor is electrically connected to the base terminal of the second NPN-type lateral bipolar transistor. A first wordline is formed to electrically connect the emitter terminal of the first NPN-type lateral bipolar transistor to the base terminal of the first PNP type lateral bipolar transistor and a second wordline is also formed to electrically connect the emitter terminal of the second NPN-type lateral bipolar transistor to the base terminal of the second PNP-type lateral bipolar transistor. The first and second wordlines are formed in a metal level. After formation of the first and second wordlines, a first bitline is formed to electrically contact the emitter terminal of the first PNP-type lateral bipolar transistor and a second bitline is also formed to electrically contact the emitter terminal of the second PNP-type transistor. The first and second bitlines are formed in another metal level.

BRIEF DESCRIPTION OF SEVERAL VIEWS OF THE DRAWINGS

FIG. 3 illustrates the I²L SRAM cell layout of FIG. 2 after forming a metal semiconductor alloy.

FIG. 4 illustrates the I²L SRAM cell layout of FIG. 3 after forming a first metal level.

FIG. 5 illustrates the I²L SRAM cell layout of FIG. 4 after forming a second metal level.

FIG. 6 illustrates the I²L SRAM cell layout of FIG. 5 after forming a third metal level.

FIG. 8 illustrates an I²L SRAM cell layout that can be employed in accordance with another embodiment of the present application.

FIG. 9 illustrates the I²L SRAM cell layout of FIG. 8 after forming a first metal level.

DETAILED DESCRIPTION

Figure 1:
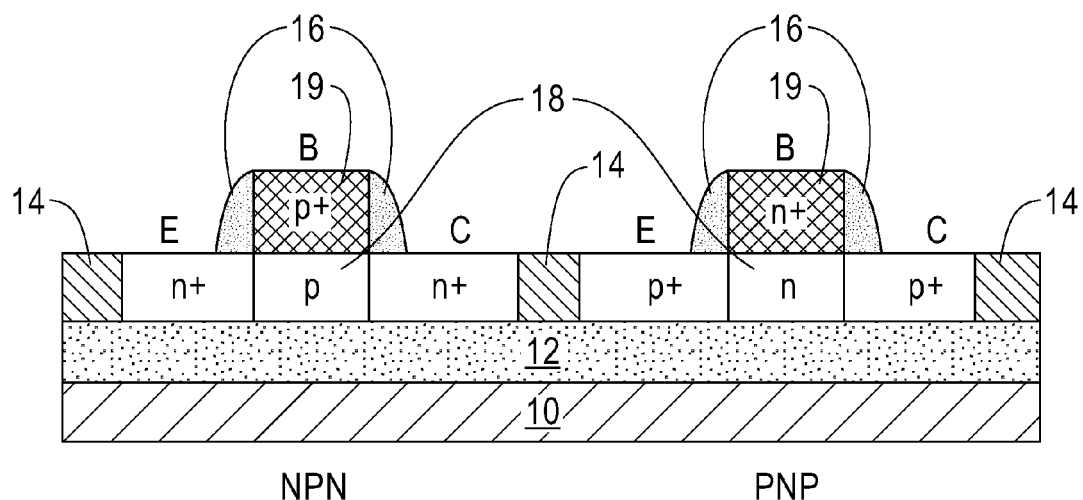
FIG. 1 is a cross sectional view illustrating a semiconductor structure including SOI symmetrical lateral bipolar transistors that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals. As used herein, ordinal such as "first", "second", and "third", etc. are used to distinguish similar elements and a same element may be labeled with different ordinals across the specification and claims.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

A static random access memory (SRAM) cell is provided that in some embodiments has an enhanced dense cell layout. In one example, the SRAM cell of the present application is about ⅓ the size of a typical CMOS (complementary metal oxide semiconductor) SRAM cell. The SRAM cell consists of two cross coupled integrated-injection logic (I²L) inverter devices. Each inverter device contains two lateral bipolar transistors (e.g., NPN- and PNP-type lateral bipolar transistors). Thus, the SRAM cell of the present application contains four transistors instead of six as is the case with standard CMOS SRAM cells. Each of the inverter devices, and hence each lateral bipolar transistor, is formed on a surface of an insulator layer of a semiconductor-on-insulator (SOI) substrate. The SRAM cell of the present application circumvents the power dissipation problem that was associated with an I²L SRAM cell containing vertical bipolar transistors by forming each of the lateral bipolar transistors on the insulator layer of the SOI substrate. The lateral bipolar transistors of the present application can thus be referred to as SOI lateral bipolar transistors.

Reference is first made to FIG. 1, which illustrates a semiconductor structure including SOI symmetrical lateral bipolar transistors, e.g., NPN or PNP lateral bipolar transistor, that can be employed in accordance with the present application. The lateral bipolar transistors, e.g., NPN or PNP lateral bipolar transistor, shown in FIG. 1 can be used in forming the first and second inverted devices of the present application.

As is shown, each lateral bipolar transistors, e.g., NPN or PNP lateral bipolar transistor, is located on a topmost surface of insulator layer 12. Insulator layer 12 may include a crystalline or non-crystalline oxide or nitride. In one embodiment, the insulator layer 12 is an oxide such as, for example, silicon dioxide. In another embodiment, the insulator layer 12 may be composed of a nitride such as, for example, silicon nitride. In yet other embodiments, the insulator layer 12 may be composed of a stack of dielectric materials such as, for example, and in any order, silicon dioxide and silicon nitride. Insulator layer 12 may have a thickness from 20 nm to 200 nm. Other thicknesses that are lesser than, or greater than, the aforementioned thickness range may also be employed as the thickness of the insulator layer 12.

The insulator layer 12 is located on a topmost surface of a handle substrate 10. The handle substrate 10 is typically a semiconductor material that has semiconducting properties. Examples of semiconductor materials that can be used as the handle substrate 10 include, but are not limited to, silicon (Si), germanium (Ge), a silicon germanium (SiGe) alloy, silicon carbide (SiC), silicon germanium carbide (SiGeC), a III-V compound semiconductors or a II-VI compound semiconductor. III-V compound semiconductors include at least one element from Group III of the Periodic Table of Elements and at least one element from Group V of the Periodic Table of Elements. II-VI compound semiconductors include at least one element from Group II of the Periodic Table of Elements and at least one element from Group VI of the Periodic Table of Elements.

Each lateral bipolar transistor, e.g., NPN or PNP lateral bipolar transistor, includes an emitter terminal, E, a base terminal, B, and a collector terminal, C. As is shown, the bottommost surface of each of the emitter terminal, E, base terminal, B, and collector terminal, C is located on a topmost surface of the insulator layer 12. As is further shown, the base terminal, B, includes, from bottom to top, an intrinsic base region 18 and an extrinsic base region 19. In some embodiments, and as shown, the topmost surfaces of the emitter terminal, E, intrinsic base region 18 of the base terminal, B, and collector terminal, C, are coplanar with each other.

The emitter terminal, E, base terminal, B, and collector terminal, C, comprise one of the semiconductor materials mentioned above for handle substrate 10. Typically, the semiconductor material that provides the emitter terminal, E, base terminal, B, and collector terminal, C, comprise a single crystalline semiconductor material such as, for example, single crystalline silicon. In some embodiments, the emitter terminal, E, base terminal, B, and collector terminal, C, comprise a same semiconductor material. In yet another embodiment, emitter terminal, E, and collector terminal, C, comprise a first semiconductor material (such as, for example, silicon) and at least a portion of the base terminal includes a second semiconductor material (such as, for example, a silicon germanium alloy) that differs from the first semiconductor material.

In FIG. 1 and throughout the present application the terms "n" or "N" denote an n-type dopant. The term "n-type dopant" refers to the addition of impurities that contribute free electrons to an intrinsic semiconductor material. In a silicon-containing semiconductor material, examples of n-type dopants, i.e., impurities, include, but are not limited to, antimony, arsenic and/or phosphorus. In FIG. 1 and throughout the present application the terms "p" or "P" denote a p-type dopant. The term "p-type dopant" refers to the addition of impurities to an intrinsic semiconductor material that creates deficiencies of valence electrons. In a silicon-containing semiconductor material, examples of p-type dopants, i.e., impurities, include, but are not limited to, boron, aluminum, gallium and/or indium.

In the present application, each emitter terminal, E, and each collector terminal, C, can contain an n-type or p-type dopant in a range from $1\times10^{19}$ atoms/cm$^3$ to $1\times10^{21}$ atoms/cm$^3$. In the present application, the intrinsic base region 18 can contain an n-type or p-type dopant concentration that is less than the overlying extrinsic base region 19. In one example, the intrinsic base region 18 can contain an n-type or p-type dopant in a range from $1\times10^{17}$ atoms/cm$^3$ to $1\times10^{19}$ atoms/cm$^3$, while the extrinsic base region 19 can contain an n-type or p-type dopant in a range from $1\times10^{19}$ atoms/cm$^3$ to $1\times10^{21}$ atoms/cm$^3$. As a general rule, and for a good device design, the emitter terminal, E, and the collector terminal, C, should have a dopant concentration larger than that of the intrinsic base region, and the dopant concentration of the extrinsic base region should be larger than that of the intrinsic base region.

As is further shown in FIG. 1, the NPN or PNP lateral bipolar transistor can be located in different device regions and can be separated by a trench isolation structure 14 which includes a trench dielectric material such as, for example, a trench oxide. Also, and in some embodiments, a dielectric spacer 16 can be present on the sidewalls of the extrinsic base region 19 of each base terminal, B, to provide insulation between the extrinsic base and the emitter and between the extrinsic base and the collector. The dielectric spacer 16 may include a dielectric spacer material such as, for example, silicon dioxide.

The semiconductor structure including SOI symmetrical lateral bipolar transistors, e.g., NPN or PNP lateral bipolar transistor, can be fabricated utilizing techniques well known in the art. For example, the semiconductor structure shown in FIG. 1 can be formed by first providing a semiconductor-on-insulator (SOI) substrate that includes, from bottom to top, the handle substrate 10, the insulator layer 12 and a topmost semiconductor material which can be used in providing the emitter and collector terminals of each lateral bipolar transistor. Lithography and etching can then be used to define the various device regions and thereafter the trench isolation structure 14 can be formed. A second lithography and etching step may be used to define an opening in each remaining portion of the topmost semiconductor material in which the base terminal, B, can be formed. Epitaxial growth can then be used to provide the base terminal, E. The epitaxial growth process may include the in-situ addition of the impurity. Ion implantation or gas phase doping could also be used. If needed, ion implantation or gas phase doping can also provide the impurity that provides the emitter terminal, E, or collector terminal, C. A detailed description of the formation of a semiconductor structure shown in FIG. 1 can be found, for example, in U.S. Pat. No. 8,531,001 to Cai et al.

Figure 2:
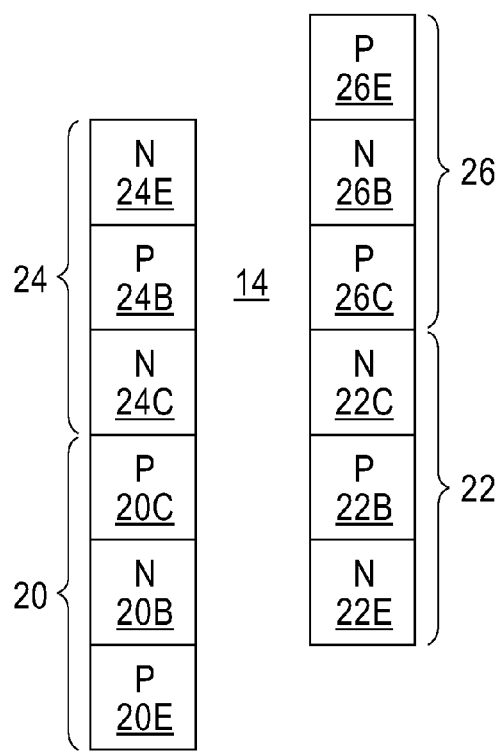
FIG. 2 illustrates an I²L SRAM cell layout that can be employed in accordance with an embodiment of the present application.

Reference is now made to FIG. 2 which illustrates an I$^2$L SRAM cell layout that can be employed in accordance with an embodiment of the present application utilizing the semiconductor structure shown in FIG. 1. As is shown, the I$^2$L SRAM cell layout includes a first inverter device (20, 22) containing a first PNP-type lateral bipolar transistor 20 and a first NPN-type lateral bipolar transistor 22. The I$^2$L SRAM cell layout also includes a second inverter device (24, 26) containing a second PNP-type lateral bipolar transistor 26 and a second NPN-type lateral bipolar transistor 24.

Each lateral bipolar transistor is present on an insulator layer (not shown) and contains an emitter terminal (20E, 22E, 24E, 26E), a base terminal (20B, 22B, 24B, and 26B) and a collector terminal (20C, 22C, 24C, 26C). In this embodiment, the emitter terminals (20E, 22E, 24E, 26E), the base terminals (20B, 22B, 24B, and 26B) and the collector terminals (20C, 22C, 24C, 26C) are of a same length.

As is shown, the second NPN-type lateral bipolar transistor 24 is located laterally adjacent second PNP-type lateral bipolar transistor 26, and the first PNP-type lateral bipolar transistor 20 is located laterally adjacent the first NPN-type lateral bipolar transistor 22. As is shown, a portion of the trench isolation structure 14 is located between the second NPN-type lateral bipolar transistor 24 and the second PNP-type lateral bipolar transistor 26, and between the first PNP-type lateral bipolar transistor 20 and the first NPN-type lateral bipolar transistor 22. As is further shown, the array of the first PNP-type lateral bipolar transistor 20 and the second NPN-type lateral bipolar transistor 24 is laterally offset from the array of the first NPN-type lateral bipolar transistor 22 and the second PNP-type lateral bipolar transistor 26. In accordance with the present application, the offset is such that the base terminal, 20B, of the first PNP-type lateral bipolar transistor 20 is aligned with the emitter terminal 22E, of the first NPN-type lateral bipolar transistor 22, and the emitter terminal 24E of the second NPN-type lateral bipolar transistor 24 is aligned with the base terminal 26B of the second PNP-type lateral bipolar transistor 26. In the design and manufacturing of an integrated-circuit chip, circuits are formed by connecting transistors using metal wires. If the metal wire has a pitch of 2F, the minimum distance of the offset is equal to F. The dimension F is an indication of how advanced the manufacturing technology is. For example, F is 40 nm for a 22-nm generation CMOS and 26 nm for a 14-nm generation of CMOS.

In this embodiment of the present application, and as shown in FIG. 2, the collector terminals (20C, 24C) of the first PNP-type lateral bipolar transistor 20 and the second NPN-type lateral bipolar transistor 24 are in direct physical contact within each other. Also and in this embodiment, the collector terminals (22C, 26C) of the first NPN-type lateral bipolar transistor 22 and the second PNP-type lateral bipolar transistor 26 are in direct physical contact with each other.

The I$^2$L SRAM cell layout of FIG. 2 can be formed utilizing the techniques mentioned above in forming the semiconductor structure of FIG. 1.

Referring now to FIG. 3, there is illustrated the I$^2$L SRAM cell layout of FIG. 2 after forming a metal semiconductor alloy 30. As is shown, the metal semiconductor alloy 30 is formed on all semiconductor material surfaces including the emitter terminals (20E, 22E, 24E, 26E), the base terminals (20B, 22B, 24B, and 26B) and the collector terminals (20C, 22C, 24C, 26C). In the present application, the metal semiconductor alloy 30 formed over the collector terminals (20C, 24C) of the first PNP-type lateral bipolar transistor 20 and the second NPN-type lateral bipolar transistor 24 are electrically connected, i.e., shorted together, and the collector terminals (22C, 26C) of the first NPN-type lateral bipolar transistor 22 and the second PNP-type lateral bipolar transistor 26 are electrically connected, i.e., shorted together. In the drawings, the areas not including the metal semiconductor alloy 30 represent the dielectric spacers mentioned within FIG. 1.

The metal semiconductor alloy 30 includes a metal semiconductor alloy forming metal and a portion of the underlying semiconductor material of each of the emitter terminals (20E, 22E, 24E, 26E), base terminals (20B, 22B, 24B, and 26B) and collector terminals (20C, 22C, 24C, 26C). In one example, the metal semiconductor alloy 30 may comprise a metal silicide.

The term "metal semiconductor alloy forming metal" is used throughout the present application to denote a metal that can react with an underlying semiconductor material to form a metal semiconductor alloy. Illustrative examples of metal semiconductor alloy forming metals that can be used in the present application include at least one of nickel (Ni), platinum (Pt), palladium (Pd), titanium (Ti), tungsten (W), and cobalt (Co). The metal semiconductor alloy forming metal can be formed by a deposition process including, for example, chemical vapor deposition, plasma enhanced chemical vapor deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy metal that is formed can have a thickness from 5 to 15 nm. Other thicknesses that are greater than or lesser than the aforementioned thickness range can also be employed as the thickness of the metal semiconductor alloy forming metal.

After providing the metal semiconductor alloy forming metal and in some embodiments of the present application, a diffusion barrier (not shown) can be formed on an exposed upper surface of the metal semiconductor alloy forming metal. In another embodiment of the present application, no diffusion barrier is provided on the exposed upper surface of the metal semiconductor alloy forming metal. When present, the diffusion barrier can include a metal nitride such as, for example, TiN or TaN, and any deposition process including those mentioned above for providing the metal semiconductor alloy forming metal may be used. When present, the diffusion barrier can have a thickness from 1 nm to 20 nm.

Next, an anneal is performed under conditions that are effective in causing the metal semiconductor alloy forming metal to diffuse into the semiconductor material portions of each of the emitter terminals (20E, 22E, 24E, 26E), base terminals (20B, 22B, 24B, and 26B) and collector terminals (20C, 22C, 24C, 26C) forming metal semiconductor alloy 30. The metal semiconductor alloy formation anneal may be performed in a single step or a two-step anneal can be used. In one embodiment and when nickel is used, the metal semiconductor alloy formation anneal can be performed at a temperature of from 200° C. to 500° C. In another embodiment, temperatures greater than 500° C. can be used. The metal semiconductor alloy formation anneal is typically performed in an ambient including, for example, argon, helium, neon and/or nitrogen. The metal semiconductor alloy formation anneal can be performed utilizing a rapid thermal anneal, a spike anneal, a microwave anneal or a laser anneal. Following the metal semiconductor alloy formation anneal, the optional diffusion barrier and any unreacted metal semiconductor alloy forming metal can be removed utilizing one or more etch processes.

Referring now to FIG. 4, there is illustrated the I$^2$L SRAM cell layout of FIG. 3 after forming a first metal level containing a conductor (in the drawing element 35A represents one portion of the first metal level, while element 35B represents a second portion of the first metal level) electrically connecting, in a cross-coupled configuration, the collector terminal 20C of the first PNP-type lateral bipolar transistor 20 to the base terminal 22B of the first NPN-type lateral bipolar transistor 22 and electrically connecting, in a cross-coupled configuration, the collector terminal 26C of the second PNP-type lateral bipolar transistor 26 to the base terminal 24B of the second NPN-type lateral bipolar transistor 24.

The first metal level (35A, 35B) includes a first interconnect dielectric material and a conductor formed in the first interconnect dielectric material. The first metal level (35A, 35B) may be formed utilizing any well known interconnect process including for example, a single damascene process, and a dual damascene process. The first interconnect dielectric material is not limited and can be a dielectric material that has a dielectric constant of 4.0 or less. Some examples of first interconnect dielectric materials that can be employed in forming the first metal level (35A, 35B) include, but are not limited to, silicon dioxide, silsesquioxanes, C doped oxides (i.e., organosilicates) that includes atoms of Si, C, O and H, or thermosetting polyarylene ethers. A single dielectric material or multiple dielectric materials may be used to provide the first interconnect dielectric material. The "polyarylene" is used in this application to denote aryl moieties which are linked together by bonds, fused rings, or inert linking groups such as, for example, oxygen, sulfur, sulfone, sulfoxide, carbonyl and the like. The interconnect dielectric material can be formed utilizing any deposition process such as, for example, chemical vapor deposition, plasma enhanced chemical vapor or spin-on coating.

The conductor that forms part of the first metal level (35A, 35B) and provides the electrical connections may include any conductive metal or metal alloy. For example, the conductor may include, but not limited to, copper, tungsten, aluminum or alloys thereof (i.e., an Al—Cu alloy). The conductor may be formed by any suitable deposition process such as, for example, chemical vapor deposition, plasma enhanced chemical vapor deposition, atomic layer deposition, sputtering, or plating. A planarization process such, as for, example, chemical mechanical polishing may follow the deposition of the conductive metal or metal alloy that provides the conductor of the first metal level (35A, 35B).

Referring now to FIG. 5, there is illustrated the I$^2$L SRAM cell layout of FIG. 4 after forming a second metal level. The second metal level is formed atop the first metal level. The second metal level contains a first wordline 40A electrically connecting the emitter terminal 22E of the first NPN-type lateral bipolar transistor 22, in a cross-coupled configuration, to the base terminal, 20B of the first PNP type lateral bipolar transistor 20 and a second wordline 40B electrically connecting, in a cross-coupled configuration, the emitter terminal 24E of the second NPN-type lateral bipolar transistor 24 to the base terminal 26B of the second PNP-type lateral bipolar transistor 26.

The second metal level includes a second interconnect dielectric material in which the first wordline 40A and the second wordline 40B are formed therein. The second interconnect dielectric material may include one of the dielectric materials mentioned above for the first interconnect dielectric material. The first wordline 40A and second wordline 40B include one of the conductors mentioned above for the first metal level. The first wordline 40A and second wordline 40B extend through the underlying first metal level. The second metal level can be formed utilizing one of the techniques mentioned above in forming the first metal level.

Referring now to FIG. 6, there is illustrates the I$^2$L SRAM cell layout of FIG. 5 after forming a third metal level. The third metal level is formed atop the second metal level. The third metal level contains a first bitline 50A electrically contacting the emitter terminal 20E of the first PNP-type lateral bipolar transistor 20 and a second bitline 50B electrically contacting the emitter terminal 26E of the second PNP-type transistor 26.

The third metal level includes a third interconnect dielectric material in which the first bitline 50A and the second bitline 40B are formed therein. The third interconnect dielectric material may include one of the dielectric materials mentioned above for the first interconnect dielectric material. The first bitline 50A and second bitline 50B include one of the conductors mentioned above for the first metal level. The first bitline 50A and second bitline 50B extend through the underlying second and first metal levels. The third metal level can be formed utilizing one of the techniques mentioned above in forming the first metal level.

Notably, FIG. 6 illustrates one SRAM memory cell of the present application. The memory cell includes a first inverter device containing a first PNP-type lateral bipolar transistor 20 and a first NPN-type lateral bipolar transistor 22, and a second inverter device containing a second PNP-type lateral bipolar transistor 26 and a second NPN-type lateral bipolar transistor 24. Each lateral bipolar transistor (20, 22, 24, 26) is present on an insulator layer 12 and contains an emitter terminal (20E, 22E, 24E, 26E), a base terminal (20B, 22B, 24B and 26B) and a collector terminal (20C, 22C, 24C, 26C). In accordance with the present application, the collector terminals (20C, 24C) of the first PNP-type lateral bipolar transistor 20 and the second NPN-type lateral bipolar transistor 24 are electrically connected, i.e., shorted together, (i.e., by metal semiconductor alloy 30) and the collector terminals (22C, 26C) of the first NPN-type lateral bipolar transistor 22 and the second PNP-type lateral bipolar transistor 26 are electrically connected, i.e., shorted together (also by metal semiconductor alloy 30).

The memory cell further includes a first metal level containing a conductor (i.e., 35A) electrically connecting the collector terminal 20C of the first PNP-type lateral bipolar transistor 20 to the base terminal 22B of the first NPN-type lateral bipolar transistor 22 and a conductor (35B) electrically connecting the collector terminal 26C of the second PNP-type lateral bipolar transistor 26 to the base terminal 24B of the second NPN-type lateral bipolar transistor 24, a second metal level containing a first wordline 40A electrically connecting the emitter terminal 22E of the first NPN-type lateral bipolar transistor 22 to the base terminal 20B of the first PNP type lateral bipolar transistor 20 and a second wordline 40B electrically connecting the emitter terminal 24E of the second NPN-type lateral bipolar transistor 24 to the base terminal 26B of the second PNP-type lateral bipolar transistor 26, and a third metal level containing a first bitline 50A electrically contacting the emitter terminal 20E of the first PNP-type lateral bipolar transistor 20 and a second bitline 50B electrically contacting the emitter terminal 26E of the second PNP-type transistor 26.

Figure 7A:
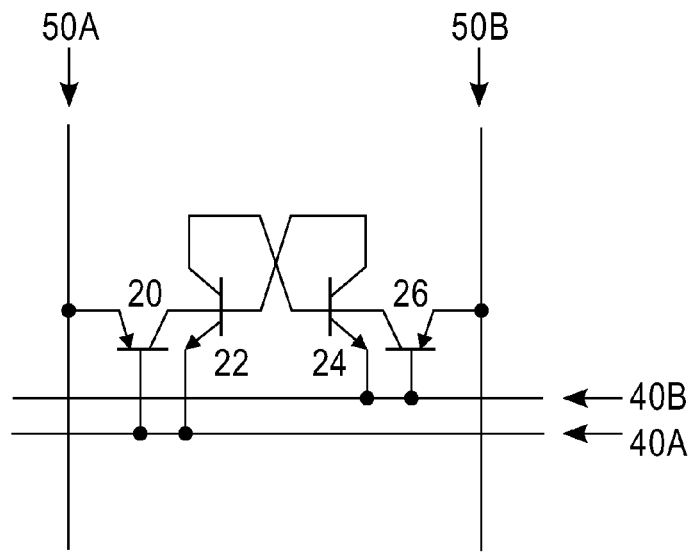
FIG. 7A is a circuit diagram of the I²L SRAM cell of FIG. 6.
Figure 7B:
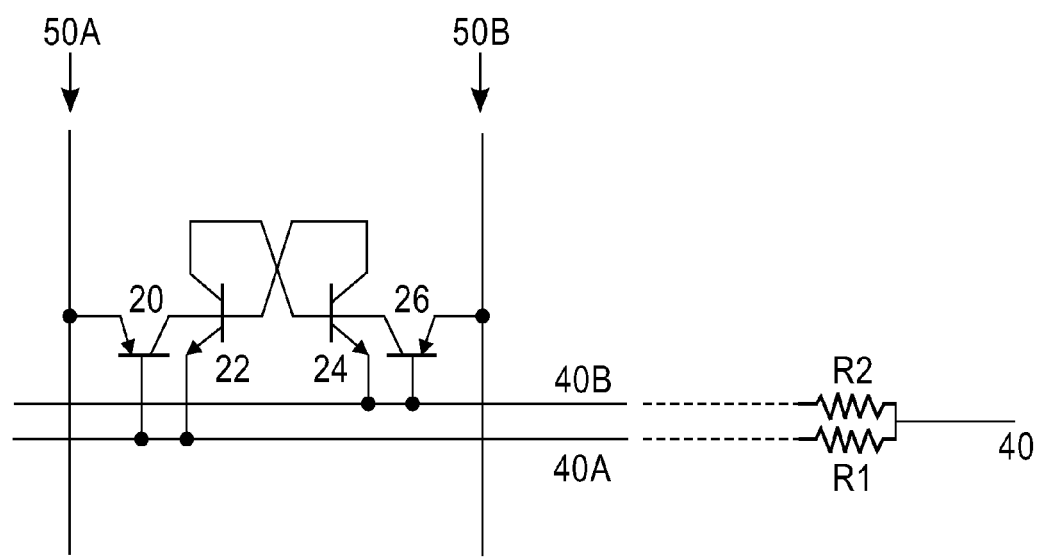
FIG. 7B illustrates the circuit of the I²L SRAM of FIG. 7A connected in an array.

Referring now to FIGS. 7A-7B, there is shown a circuit diagram of the I$^2$L SRAM cell of FIG. 6. In a memory cell array environment as is shown in FIG. 7B (FIG. 7A is not within an array environment), the wordline 40A and 40B are connected via resistors R1 and R2 to form a common wordline 40, as illustrated in FIG. 7B. All the memory cells in the array connected to wordline 40A share the same resistor R1 and all the memory cells in the array connected to wordline 40B share the same resistor R2. Wordline 40 controls wordlines 40A and 40B via resistors R1 and R2. In operation in standby mode, wordline 40 is held at a small voltage, e.g., 0.4V, above ground and a very small current, e.g., a few nanoamperes, is applied to each bitline (50A, 50B). One of the NPN-type lateral bipolar transistors, e.g., NPN 22, in the memory cell is in the on state, while the other NPN-type lateral bipolar transistor, e.g., NPN 24, in the memory cell is in the off state. To read the memory cell, the cell is selected by lowering its wordline 40 to ground, and a read current of a few microamperes is applied to each bitline (50A, 50B). The read current causes a larger voltage drop across R1, which is connected to NPN 22 which is in the on state, than across R2, which is connected to NPN 24 which is in the off state. This difference in voltage across R1 and R2 causes bitline 50A to be at a higher voltage than bitline 50B. The memory cell is read by detecting the voltage difference between bitline 50A and bitline 50B. For writing the memory cell, wordline 40 is lowered to ground and equal currents are applied to bitline 50A and 50B, similar to reading the cell. If the write operation is to turn NPN 24 on and NPN 22 off, then the current in bitline 50B is diverted to ground, leaving the current in bitline 50A to force NPN 24 to turn on. A detailed description of the operation of an I$^2$L SRAM cell can be found, for example, in IEEE Journal of Solid-State Circuits, vol. SC-16, p. 429, 1981.

Referring now to FIG. 8, there is illustrated an I$^2$L SRAM cell layout that can be employed in accordance with another embodiment of the present application. As is shown, the I$^2$L SRAM cell layout includes a first inverter device (20, 22) containing a first PNP-type lateral bipolar transistor 20 and a first NPN-type lateral bipolar transistor 22. The I$^2$L SRAM cell layout also includes a second inverter device (24, 26) containing a second PNP-type lateral bipolar transistor 26 and a second NPN-type lateral bipolar transistor 24. Each lateral bipolar transistor is present on an insulator layer (not shown) and contains an emitter terminal (20E, 22E, 24E, 26E), a base terminal (20B, 22B, 24B, and 26B) and a collector terminal (20C, 22C, 24C, 26C). In this embodiment, the emitter terminals (20E, 26E), the base terminals (20B, 22B, 24B, and 26B) and the collector terminals (20C, 22C, 24C, 26C) are of a same length. The emitter terminal 22E and 24E have a length that is greater than a length of the other terminals.

As is shown, the second NPN-type lateral bipolar transistor 24 is located laterally adjacent the second PNP-type lateral bipolar transistor 26, and the first PNP-type lateral bipolar transistor 20 is located laterally adjacent the first NPN-type lateral bipolar transistor 22. As is shown, a portion of the trench isolation structure 14 is located between the second NPN-type lateral bipolar transistor 24 and the second PNP-type lateral bipolar transistor 26, and between the first PNP-type lateral bipolar transistor 20 and the first NPN-type lateral bipolar transistor 22. As is further shown, the array of the first PNP-type lateral bipolar transistor 20 and the second NPN-type lateral bipolar transistor 24 is laterally offset from the array of the first NPN-type lateral bipolar transistor 22 and the second PNP-type lateral bipolar transistor 26. In accordance with the present application, the offset is such that the base terminal, 20B, of the first PNP-type lateral bipolar transistor 20 is aligned with the emitter terminal 22E, of the first NPN-type lateral bipolar transistor 22, and the emitter terminal 24E of the second NPN-type lateral bipolar transistor 24 is aligned with the base terminal 26B of the second PNP-type lateral bipolar transistor 26. In the design and manufacturing of an integrated-circuit chip, circuits are formed by connecting transistors using metal wires. If the metal wire has a pitch of 2F, the minimum distance of the offset is equal to F. The dimension F is an indication of how advanced the manufacturing technology is. For example, F is 40 nm for a 22-nm generation CMOS and 26 nm for a 14-nm generation of CMOS.

In this embodiment of the present application, and as shown in FIG. 8, the collector terminals (20C, 24C) of the first PNP-type lateral bipolar transistor 20 and the second NPN-type lateral bipolar transistor 24 are spaced apart from each other. A portion of the trench isolation structure 14 is located between the collector terminal 20C of the first PNP-type lateral bipolar transistor 20 and the collector terminal 24C of the second NPN-type bipolar transistor 24. Also and in this embodiment, the collector terminals (22C, 26C) of the first NPN-type lateral bipolar transistor 22 and the second PNP-type lateral bipolar transistor 26 are spaced apart from each other. A portion of the trench isolation structure 14 is located between the collector terminal 22C of the first NPN-type lateral bipolar transistor 22 and the collector terminal 26C of the second PNP-type lateral bipolar transistor 26.

The I$^2$L SRAM cell layout of FIG. 8 can be formed utilizing the techniques mentioned above in forming the semiconductor structure of FIG. 1.

Referring now to FIG. 9, there is illustrated the I$^2$L SRAM cell layout of FIG. 8 after forming a first metal level. The first metal level contains a conductor (in the drawing element 38A represents one portion of the first metal level, while element 38B represents a second portion of the first metal level) which electrically connects the collector terminals (20C, 24C) of the first PNP-type lateral bipolar transistor 20 and the second NPN-type lateral bipolar transistor 24 together and also electrically connects the collector terminals (22C, 26C) of the first NPN-type lateral bipolar transistor 22 and the second PNP-type lateral bipolar transistor 26 together. The first metal level contains a first interconnect dielectric material and a conductor as described above.

Figure 10:
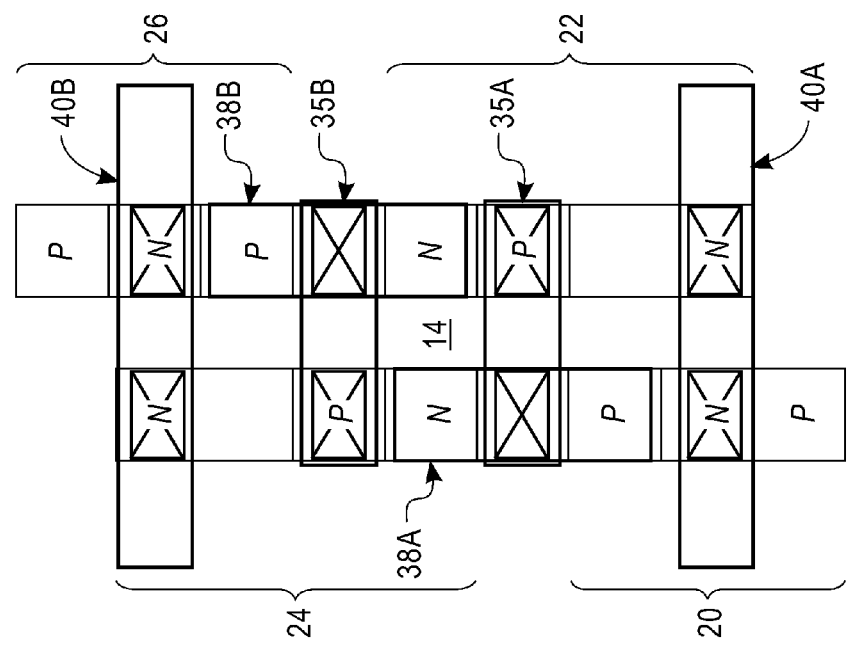
FIG. 10 illustrates the I²L SRAM cell layout of FIG. 9 after forming a second metal level.

Referring now to FIG. 10, there is illustrated the I$^2$L SRAM cell layout of FIG. 9 after forming a second metal level. The second metal level contains conductors within a second interconnect dielectric material (see description above within respect materials for the second interconnect material and conductors) In this embodiment, the portion labeled as 35A contains a conductor which electrically connects, in a cross-coupled configuration, the collector terminal 20C of the first PNP-type lateral bipolar transistor 20 to the base terminal 22B of the first NPN-type lateral bipolar transistor 22 and the portion labeled as 35B contains a conductor that electrically connects, in a cross-coupled configuration, the collector terminal 26C of the second PNP-type lateral bipolar transistor 26 to the base terminal 24B of the second NPN-type lateral bipolar transistor 24.

Also, and within the second metal level, a first wordline 40A is formed that electrically connects the emitter terminal 22E of the first NPN-type lateral bipolar transistor 22, in a cross-coupled configuration, to the base terminal, 20B of the first PNP type lateral bipolar transistor 20 and a second wordline 40B is also formed that electrically connects, in a cross-coupled configuration, the emitter terminal 24E of the second NPN-type lateral bipolar transistor 24 to the base terminal 26B of the second PNP-type lateral bipolar transistor 26.

Figure 11:
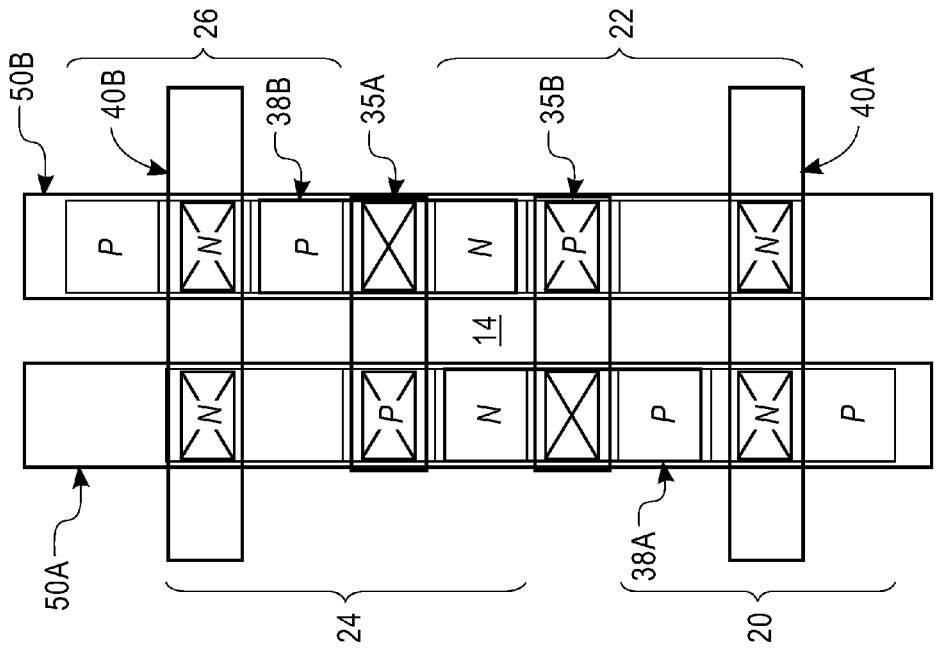
FIG. 11 illustrates the I²L SRAM cell layout of FIG. 11 after forming a third metal level.

Referring now to FIG. 11, there is illustrated the I$^2$L SRAM cell layout of FIG. 10 after forming a third metal level. The third metal level contains conductors within a third interconnect dielectric material (see description above within respect materials for the third interconnect material and conductors). Notably, and in the third metal layer, a first bitline 50A is formed that electrically contacts the emitter terminal 20E of the first PNP-type lateral bipolar transistor 20 and a second bitline 50B is also formed that electrically contacts the emitter terminal 26E of the second PNP-type transistor 26.

The SRAM memory cell of FIG. 11 is essentially the same as that described above for FIG. 6. Also, the SRAM memory cell of FIG. 11 has the same circuit diagram as shown in FIGS. 7A-7B and it can be operated in the same manner as described above.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A static random access memory (SRAM) cell comprising:
    a first inverter device containing a first PNP-type lateral bipolar transistor and a first NPN-type lateral bipolar transistor; and
    a second inverter device containing a second PNP-type lateral bipolar transistor and a second NPN-type lateral bipolar transistor, wherein each lateral bipolar transistor is present on an insulator layer and contains an emitter terminal, a base terminal and a collector terminal, and wherein
        said collector terminals of said first PNP-type lateral bipolar transistor and said second NPN-type lateral bipolar transistor are electrically connected, and said collector terminals of said first NPN-type lateral bipolar transistor and said second PNP-type lateral bipolar transistor are electrically connected,
        said collector terminal of said first PNP-type lateral bipolar transistor is electrically connected to said base terminal of said first NPN-type lateral bipolar transistor and said collector terminal of said second PNP-type lateral bipolar transistor is electrically connected to said base terminal of said second NPN-type lateral bipolar transistor,
    a first wordline electrically connecting said emitter terminal of said first NPN-type lateral bipolar transistor to said base terminal of said first PNP-type lateral bipolar transistor, and a second wordline electrically connecting said emitter terminal of said second NPN-type lateral bipolar transistor to said base terminal of said second PNP-type lateral bipolar transistor, and
    a first bitline electrically contacting said emitter terminal of said first PNP-type lateral bipolar transistor, and a second bitline electrically contacting said emitter terminal of said second PNP-type lateral bipolar transistor.

2. The SRAM cell of claim 1, wherein said second NPN-type lateral bipolar transistor is located laterally adjacent said second PNP-type lateral bipolar transistor, and said first PNP-type lateral bipolar transistor is located laterally adjacent said first NPN-type lateral bipolar transistor.

3. The SRAM cell of claim 2, wherein said collector terminals of said first PNP-type lateral bipolar transistor and said second NPN-type lateral bipolar transistor are in direct physical contact within each other and said collector terminals of said second PNP-type lateral bipolar transistor and said first NPN-type lateral bipolar transistor are in direct physical contact with each other.

4. The SRAM cell of claim 3, wherein a metal semiconductor alloy is located on said collector terminals of each of said first PNP-type lateral bipolar transistor, said second NPN-type lateral bipolar transistor, said second PNP-type lateral bipolar transistor and said first NPN-type lateral bipolar transistor.

5. The SRAM cell of claim 4, wherein a conductor within a first metal level provides said electrical connection between said collector terminal of said first PNP-type lateral bipolar transistor and said base terminal of said first NPN-type lateral bipolar transistor, and another conductor in said first metal level provides said electrical connection between said collector terminal of said second PNP-type lateral bipolar transistor and said base terminal of said second NPN-type lateral bipolar transistor.

6. The SRAM cell of claim 5, wherein said first wordline and said second wordline are located in a second metal level, and wherein said first bitline and said second bitline are located in a third metal level.

7. The SRAM cell of claim 6, wherein said SRAM cell has a size of from 7F×4F.

8. The SRAM cell of claim 1, wherein said collector terminals of said first PNP-type lateral bipolar transistor and said second NPN-type lateral bipolar transistor are spaced apart from each other and said collector terminals of said second PNP-type lateral bipolar transistor and said first NPN-type lateral bipolar transistor are spaced apart from each other.

9. The SRAM cell of claim 8, wherein a first metal level containing a conductor is located on said collector terminals of said first PNP-type lateral bipolar transistor and said second NPN-type lateral bipolar transistor that are spaced apart from each other, and wherein another first metal level containing a conductor is located on said collector terminals of said second PNP-type lateral bipolar transistor and said first NPN-type lateral bipolar transistor that are spaced apart from each other.

10. The SRAM cell of claim 9, wherein said conductor of said first metal level provides said electrical connection between said collector terminals of said first PNP-type lateral bipolar transistor and said second NPN-type lateral bipolar transistor, and between said collector terminals of said first NPN-type lateral bipolar transistor and said second PNP-type lateral bipolar transistor.

11. The SRAM cell of claim 9, wherein said first wordline and said second wordline are located in a second metal level, and wherein said first bitline and said second bitline are located in a third metal level, and wherein a conductor within said second metal level provides said electrical connection between said collector terminal of said first PNP-type lateral bipolar transistor and said base terminal of said first NPN-type lateral bipolar transistor, and said another conductor in said first metal level provides said electrical connection between said collector terminal of said second PNP-type lateral bipolar transistor and said base terminal of said second NPN-type lateral bipolar transistor.

12. The SRAM cell of claim 11, wherein said SRAM cell has a size of from 9F×4F.

13. The SRAM cell of claim 1, wherein a bottommost surface of each of said collector terminals, said base terminals and said emitter terminals is in direct physical contact with a topmost surface of said insulator layer.

14. A method of forming a static random access memory (SRAM) cell, said method comprising:
providing a first inverter device containing a first PNP-type lateral bipolar transistor and a first NPN-type lateral bipolar transistor, and a second inverter device containing a second PNP-type lateral bipolar transistor and a second NPN-type lateral bipolar transistor, wherein each lateral bipolar transistor is present on an insulator layer and contains an emitter terminal, a base terminal and a collector terminal;
first electrically connecting said collector terminals of said first PNP-type lateral bipolar transistor and said second NPN-type lateral bipolar transistor together and said collector terminals of said first NPN-type lateral bipolar transistor and said second PNP-type lateral bipolar transistor together;
second electrically connecting said collector terminal of said first PNP-type lateral bipolar transistor to said base terminal of said first NPN-type lateral bipolar transistor and to electrically connect said collector terminal of said second PNP-type lateral bipolar transistor to said base terminal of said second NPN-type lateral bipolar transistor;
forming, in a metal level, a first wordline to electrically connect said emitter terminal of said first NPN-type lateral bipolar transistor to said base terminal of said first PNP type lateral bipolar transistor and a second wordline to electrically connect said emitter terminal of said second NPN-type lateral bipolar transistor to said base terminal of said second PNP-type lateral bipolar transistor; and
forming, in another metal level, a first bitline to electrically contact said emitter terminal of said first PNP-type lateral bipolar transistor and a second bitline to electrically contact said emitter terminal of said second PNP-type transistor.

15. The method of claim 14, wherein said collector terminals of said first PNP-type lateral bipolar transistor and said second NPN-type lateral bipolar transistor are in direct physical contact within each other and said collector terminals of said second PNP-type lateral bipolar transistor and said first NPN-type lateral bipolar transistor are in direct physical contact with each other.

16. The method of claim 15, wherein said first electrically connecting comprising forming a metal semiconductor alloy on said collector terminals of each of said first PNP-type lateral bipolar transistor, said second NPN-type lateral bipolar transistor, said second PNP-type lateral bipolar transistor and said first NPN-type lateral bipolar transistor.

17. The method of claim 16, wherein a trench isolation structure is formed separating said first inverter device from said second inverter device.

18. The method of claim 14, wherein said collector terminals of said first PNP-type lateral bipolar transistor and said second NPN-type lateral bipolar transistor are spaced apart from each other and said collector terminals of said second PNP-type lateral bipolar transistor and said first NPN-type lateral bipolar transistor are spaced apart from each other.

19. The method of claim 18, wherein said first electrically connecting comprises forming a first metal level containing a conductor on said collector terminals of said first PNP-type lateral bipolar transistor and said second NPN-type lateral bipolar transistor that are spaced apart from each other, and forming another first metal containing a conductor on said collector terminals of said second PNP-type lateral bipolar transistor and said first NPN-type lateral bipolar transistor.

20. The method of claim 19, wherein a trench isolation structure is formed separating said first inverter device from said second inverter device.

* * * * *